United States Patent [19]

Sugasawara et al.

[11] Patent Number: 6,064,220
[45] Date of Patent: May 16, 2000

[54] SEMICONDUCTOR INTEGRATED CIRCUIT FAILURE ANALYSIS USING MAGNETIC IMAGING

[75] Inventors: Emery Sugasawara, Pleasanton; Stefan Graef, Milpitas, both of Calif.

[73] Assignee: LSI Logic Corporation, Milpitas, Calif.

[21] Appl. No.: 08/902,343

[22] Filed: Jul. 29, 1997

[51] Int. Cl.[7] .................................................. G01R 31/28
[52] U.S. Cl. ............................ 324/765; 324/529; 324/95
[58] Field of Search ................................ 324/765, 158.1, 324/261, 529, 73.1; 317/235

[56] References Cited

U.S. PATENT DOCUMENTS

| | | | |
|---|---|---|---|
| 3,303,400 | 2/1967 | Allison | 317/235 |
| 5,073,754 | 12/1991 | Henley | 324/529 |
| 5,150,042 | 9/1992 | Look et al. | 324/73.1 |
| 5,543,988 | 8/1996 | Brady et al. | 360/112 |

*Primary Examiner*—Josie Ballato
*Assistant Examiner*—Minh Tang

[57] ABSTRACT

Magnetic sensors are positioned adjacent a semiconductor integrated circuit under test while the circuit is subjected to selected electrical stimuli for purposes of failure analysis. The magnetic image data can be acquired from one or more selected locations about the circuit without any physical connection. By comparing the magnetic sensor information to a predetermined database of magnetic information acquired from known devices, failure modes can be identified. Conventional tester equipment can be used for providing the electrical stimuli to the device under test.

20 Claims, 2 Drawing Sheets

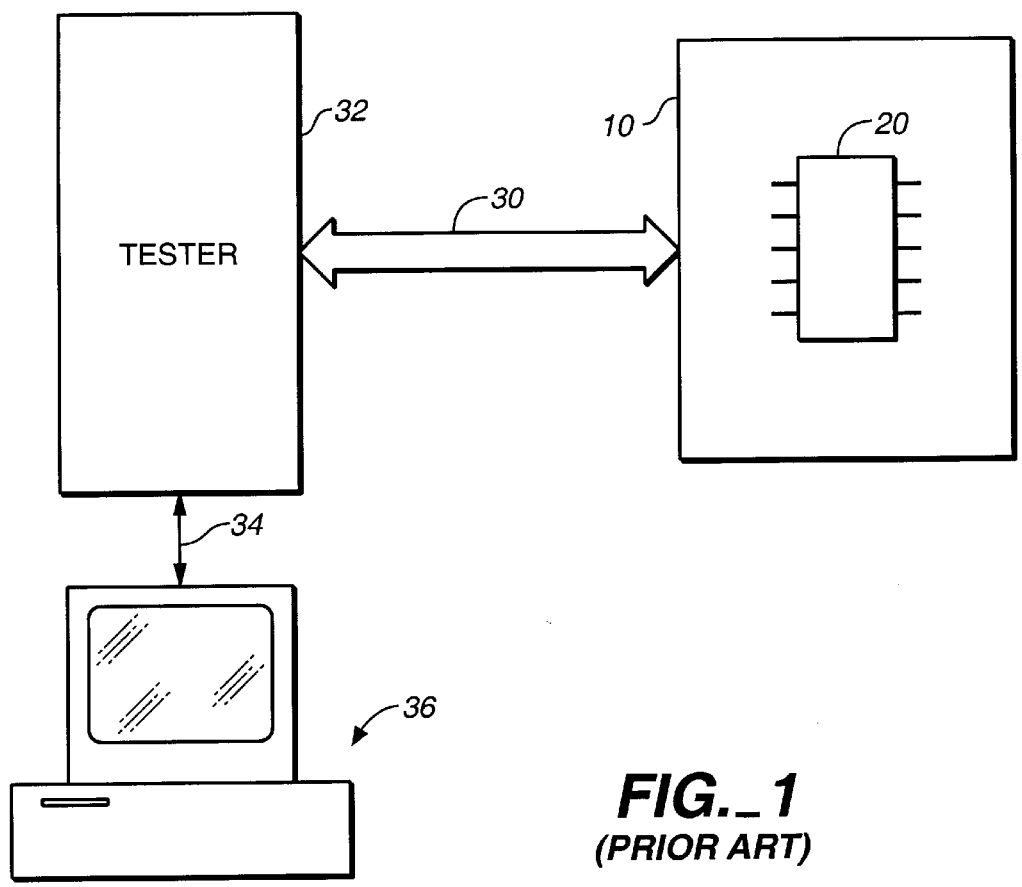
FIG._1
*(PRIOR ART)*
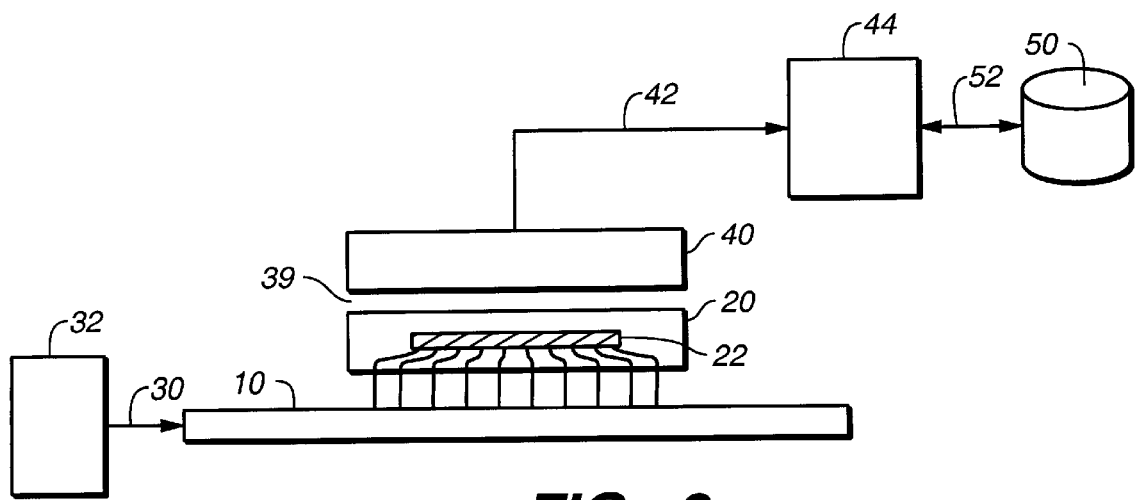
FIG._2

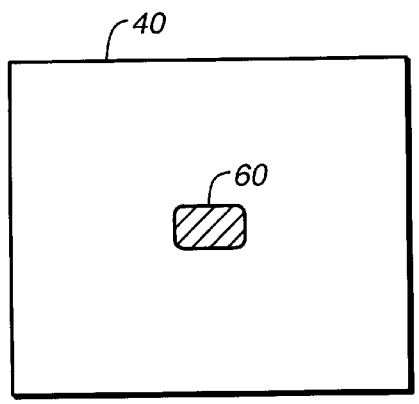
FIG._3
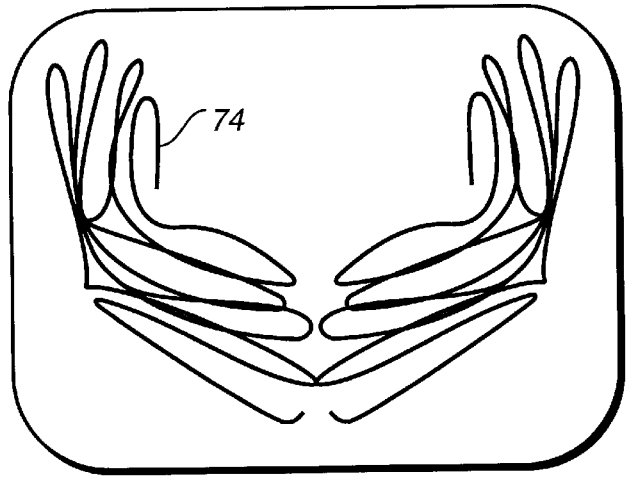
FIG._5
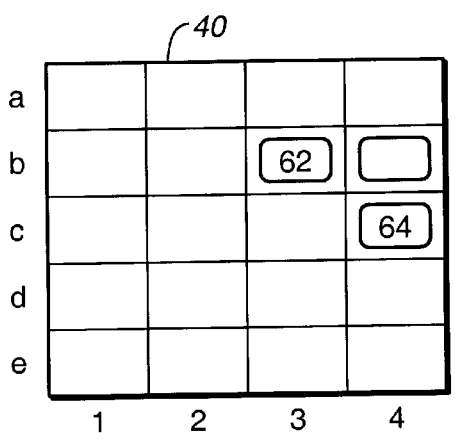
FIG._4
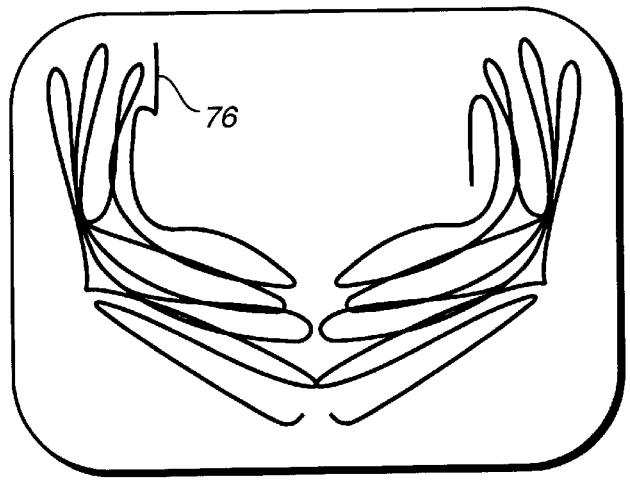
FIG._6

SEMICONDUCTOR INTEGRATED CIRCUIT FAILURE ANALYSIS USING MAGNETIC IMAGING

The present invention lies in the field of semiconductor integrated circuit failure analysis and, more specifically, is directed to applying magnetic imaging technology in support of identifying and/or characterizing failures in semiconductor integrated circuits.

BACKGROUND OF THE INVENTION

Semiconductor integrated circuits designs and manufacturing techniques continue to evolve. Great progress has been made over the past generation in all phases of integrated circuit manufacturing so as to improve reliability of the finished products. Reliability of integrated circuits is of paramount importance to all concerned: the manufacturer, the OEM customer, and the end used. Indeed, in some "mission critical" applications, such as medicine or extra terrestrial applications, reliability of such circuits can be a matter of life and death. Even in more pedestrian applications, circuit failures lead to wasted time and expense, not to mention erosion of the manufacturer's reputation.

Although, in general, reliability of integrated circuits has become very high, the relentless push toward higher levels of integration, while maintaining high levels of reliability, presents an ongoing challenge. Part of the integrated circuit manufacturer's quest to improve reliability involves failure analysis—the analysis of failed parts in order to determine what caused the failure. Most manufacturers have extensive failure analysis departments, staffed by engineers and other professionals who are skilled in this specialty. Traditional methods of failure analysis include the following: Applying selected voltages to circuit inputs and examining selected output voltage levels, either through the use of a functional tester, mechanical probing system, or the use of an electron beam detection system. Another known method of failure analysis is to apply selected voltages at certain pins and measure the current that the IC draws in response. Another method involves applying selected currents at certain inputs and measuring the voltage levels or, applying selected voltages to predetermined pins and looking for "hot spots" on the integrated circuit ("IC") through either emission microscopy or infrared detection systems.

A primary disadvantage or limitation of known failure analysis methodologies is that they are limited to the use of electrical stimuli and the responses under examination are limited to electrical responses, photo emissions, or infrared emissions. When electrical stimulus is used, the response is limited to the output pins of the IC which in turn requires the use of additional hardware to detect the responses. This hardware is usually referred to as a device under test (DUT) board. The DUT board itself can introduce unwanted responses or affect the device responses in ways that can confuse the tester/failure analysis tool. In other words, the DUT testing equipment itself can corrupt the failure analysis. Where emission microscopy or infrared methods are used, the IC must have the suspect circuit exposed so that the emission microscopy or infrared systems can detect the hot spots. This typically requires decapping or some type of deprocessing of the IC in order to expose the circuit. These steps are time consuming and can themselves introduce defects into the IC which essentially renders the entire failure analysis suspect, if not useless.

Accordingly, it would be desireable to be able to identify and detect defects without the use of traditional DUT boards, or without going through all of the traditional electrical tests such as continuity, functional or other type of DC tests. Additionally, it would be desirable to be able to detect defects in ICs that are not detectable using traditional testing techniques such as those described above.

SUMMARY OF THE INVENTION

In view of the foregoing background summary, it is an object of the present invention to employ magnetic sensing technology in connection with failure analysis of integrated circuits.

Another object of the invention is to provide a test system for acquiring magnetic field information from an area adjacent an IC under test while the IC is being subjected to selected electrical stimulation.

A further object of the invention is to provide for building a database of magnetic data for use in connection with an IC failure analysis.

Another object of the invention is to use magnetic sensing for localization of failures in semiconductor integrated circuits.

A still further object is to enable the use of magnetic sensing technology in order to perform tests of integrated circuits so as to detect defects which are not detectable using conventional electrical testing techniques.

One aspect of the invention includes a method of conducting failure analysis of a semiconductor integrated circuit. The method begins with selection of an IC for testing. The method next calls for applying a predetermined electrical stimulus to at least one input of the IC. And then, generally while the electrical stimulus is applied, one or more magnetic sensors are used for capturing magnetic field information from a location adjacent the integrated circuit so as to determine a magnetic response of the integrated circuit to the electrical stimulus.

The captured magnetic field data can be compared to a predetermined database of data acquired from similar stimulation of devices already known to be good—for final test applications, or devices known to be bad—for failure analysis. In other words, the database preferably contains one or more standards previously acquired from failed devices for comparison to identify similar failures in a DUT. The system can use one or more discrete magnetic field values, or a graphics file that represents an image of the magnetic field as detected over an area of the IC surface. The magnetic sensing is not limited to the top surface of the chip as illustrated. Rather, sensors can be arranged over any one or more surfaces of the chip—above, below, or beside it.

Another aspect of the invention includes an IC failure analysis system comprising a tester for generating electrical stimuli; a DUT board having a socket for receiving an IC device for testing; a magnetic sensor positioned adjacent the socket to detect a magnetic field about the IC when an IC is inserted in the socket and subjected to the electrical stimuli; and equipment for capturing data from the magnetic sensor indicative of the magnetic field while the device is subjected to the electrical stimuli. Conventional data acquisition hardware and software can be used.

The foregoing and other objects, features and advantages of the invention will become more readily apparent from the following detailed description of a preferred embodiment which proceeds with reference to the drawings.

BRIEF DESCRIPTION OF THE DRAWINGS

FIG. 1 is a simplified block diagram of a prior art integrated circuit testing system.

FIG. 2 is a simplified block diagram of an integrated circuit testing system according to the present invention.

FIG. 3 is a top plan view illustrating use of a single magnetic sensor element in the magnetic sensor assembly of FIG. 2.

FIG. 4 illustrates a rectangular array of magnetic sensor elements together forming a magnetic sensor assembly useful in the system of FIG. 2.

FIG. 5 is a conceptual illustration of a two-dimensional image indicative of magnetic field information acquired or stored in a system of the type illustrated in FIG. 2.

FIG. 6 is another example of a two-dimensional image indicative of magnetic field information for comparison to the image of FIG. 5.

DETAILED DESCRIPTION OF A PREFERRED EMBODIMENT

FIG. 1 is a simplified diagram of a prior art tester system made up of the following elements. A device under test or DUT board 10 includes a socket for receiving and establishing electrical connection with an integrated circuit 20. The DUT board provides for electrical connection between the socket 20 and tester equipment 32 via a suitable bus 30 which may be implemented, for example, as a ribbon cable. Many types of manual and automatic tester equipment 32 are well known in the industry for providing electrical testing of integrated circuits as described briefly in the background section. The tester equipment 32 may be a stand alone machine, or may be operated in conjunction with a computer 36 interconnected with the tester 32 via cabling or other network interface 34. For example, the computer 36 may be used to develop and/or deploy test program software for controlling the tester. Conversely, the computer may be used to acquire data during test activities. In the present context of failure analysis, the tester equipment would be used to deploy failure analysis testing programs.

FIG. 2 illustrates a magnetic imaging failure analysis system according to the present invention. As before, an integrated circuit 20 is mounted in a suitable socket on a DUT board 10. More specifically, the integrated circuit package 20 includes circuitry 22 housed within suitable packaging as is well known in the industry. The integrated circuit is connected via the DUT board 10 and conductors 30 to a control unit 32. This unit can be implemented as standard tester equipment, suitably configured for providing selected electrical stimuli to selected pins of the integrated circuit under test. In FIG. 2, the arrowhead on bus 30 is intended to indicate that the test equipment 32 is used primarily to provide electrical stimulus to the integrated circuit, as distinguished from measuring the results of those stimuli.

A magnetic sensor assembly 40 is arranged generally in parallel with a top surface of the integrated circuit 20 and is spaced apart therefrom by a predetermined distance 39. The particular arrangement of the magnetic sensor assembly and its location will depend upon the specific implementation and the sensor components used in the application. The sensor assembly 40 is connected via bus 42 to an apparatus 44 for capturing magnetic field measurement data from the sensor assembly 40. The data capturing apparatus 44 may be implemented, for example, on a computer. The particulars of various types of data acquisition from sensors into a computer are well-known and therefore are omitted here. To cite one example, the Hewlett-Packard Company produces a wide variety of test and measurement, data acquisition and computer products and, more specifically, interfacing hardware and software—e.g. the HPIB bus—for assembling those components into a data acquisition system. Magnetic sensor data then can be stored on any machine-readable storage device 50, such as a hard disk or tape drive. Disk drive 50 is coupled to the data acquisition apparatus 44 via a suitable bus or network connection 52.

FIG. 3 is essentially a bottom view of the magnetic sensor assembly 40, showing a single, centrally-located magnetic sensor element 60. Various magnetic sensor elements are commercially available, although none has been deployed for this particular application as far as is known by the present inventors. One example of commercially-available magnetic sensors are those made and sold by Honeywell Corporation, Solid State Electronic Center, Plymouth, Minnesota. The Honeywell magnetic sensor product line includes magneto-resistive sensors available in single, dual and three-axis configurations. These sensors typically include a magneto-resistive bridge circuit for sensing magnetic fields and converting that information to a differential output voltage. Honeywell's HMR2300, for example, is a three-axis digital magnetometer that detects the strength and direction of a magnetic field and communicates the X, Y and Z components directly to a computer. The magnetic field is converted to three 16-bit values using a hybrid circuit, A/D convertors, and an onboard microprocessor. Data is serially output over standard serial interface protocols. That device has a field resolution of 70 $\mu$GAUSS. Various magnetic sensors are also commercially available from Cherry Electrical Products and from Pasco Scientific.

FIG. 4 is a simplified illustration of an alternative arrangement of the magnetic sensor assembly 40. In this example, a rectangular array of twenty individual magnetic sensors is shown, including, for example, individual sensors 62 and 64. The use of multiple magnetic sensors will provide for a greater resolution in many cases, depending upon the specific geometries of the selected devices.

OPERATION

Operation of the system described above for failure analysis requires three steps: first, acquiring a database of magnetic information; second, capturing magnetic information about a device under test while applying electrical stimulation to the device; and third, comparing the captured magnetic information to the previously established standards in support of identifying specific failures, or localizing the chip failure. By "localizing" we mean identifying a particular location on the integrated circuit where the failure occurred.

The system of FIG. 2 can be used to develop a machine-readable database for use in support of failure analysis. First, a particular integrated circuit is selected for inclusion in the database. The test engineer designs a desired electrical stimulus pattern for stimulating that IC to a desired operating state. After mounting the integrated circuit in the DUT board as illustrated in FIG. 2, the test equipment 32 is activated so as to apply the electrical stimulus to the IC. Next, magnetic sensor information from the sensor assembly 40 is captured by the data capture apparatus 44. And finally, that information can be stored for example in the disk drive 50.

Additional tests, using various different electrical stimulus patterns, can be conducted for the same integrated circuit, and corresponding magnetic sensor data accumulated. The same process can be carried out for many different stimulus patterns, and of course, for various different integrated circuits. The present invention is applicable to a wide variety of semiconductor integrated circuits, including, without limitation, logic circuits, controllers, microprocessors, ASICs, memory devices, hybrid devices, etc. The specific types of tests and sensor analysis will also depend upon the specific magnetic sensors used in a given application.

The magnetic sensor data acquired in response to electrical stimulation of the IC can take various forms. At the simplest level, a single measurement of magnetic field strength may be useful. In most cases, additional information at higher resolution will be more useful. This information can be stored and used in various ways. For example, the integrated circuit package or the "field of view" of the sensor, can be functionally divided into an rectangular array, for example, 100 by 100 cells. A quantitative magnetic field strength value can be recorded for each cell. By acquiring this information for "good" ICs, i.e., those that have passed final test, and comparing this information to corresponding data acquired from various failed devices, the engineer can build a database of magnetic information quite useful in failure analysis. Programming the computer 44 for a cell-by-cell comparison of two arrays is straightforward.

Another approach is to use graphics imaging. For example, FIG. 5 is a simplified representation of a hypothetical two-dimensional image acquired through magnetic sensors. For discussion, we assume that FIG. 5 is an image acquired during testing of a known good or standard device. FIG. 6 illustrates a similar image which was hypothetically acquired by magnetic imaging during testing of another IC of the same type. It can be observed that there are differences in the magnetic field lines 74 in FIG. 5 as compared to the same region 76 in FIG. 6. This difference then can be associated with a given failure mode in the database. Digital signal processing technology can be used to implement this type of comparison of graphical images.

It will be appreciated that engineers will be able to apply this invention to a wide variety of applications for many different circuits. Just as there are a large number of possible electrical stimulus patterns, and a wide variety of failure modes, so too it is expected that engineers will develop substantial magnetic imaging databases for use in failure analysis.

Having illustrated and described the principles of my invention in a preferred embodiment thereof, it should be readily apparent to those skilled in the art that the invention can be modified in arrangement, and detail without departing from such principles. We claim all modifications coming within the spirit and scope of the accompanying claims.

We claim:

1. A method of characterizing an integrated circuit having a functional circuitry area and a connection area with a plurality of pins for input and output of electrical signals to the functional circuitry area, comprising the steps of:

producing a magnetic response from the functional circuitry area by applying a predetermined electrical stimulus to at least one of the pins of the connection area, sensing the magnetic response of the functional circuitry area at each of a plurality of positions across the functional circuitry area of the integrated circuit, capturing a quantitative indication of a strength of the magnetic response at each of the plurality of positions across the functional circuitry area of the integrated circuit, creating a magnetic response array for the functional circuitry area based on the captured quantitative indications of the magnetic field strength at the plurality of positions, and comparing the magnetic response array of the integrated circuit to at least one predetermined magnetic response array for a reference integrated circuit having a known characteristic; and characterizing the integrated circuit based at least in part on the comparison between the integrated circuit and the reference integrated circuit.

2. The method of claim 1 wherein the known characteristic of the reference integrated circuit is that the reference integrated circuit is fully functional within specified tolerances.

3. The method of claim 1 wherein the known characteristic of the reference integrated circuit is that the reference integrated circuit has at least one known defect.

4. The method of claim 1 wherein the magnetic responses further comprise at least one of magnetic reflections, magnetic resonances, magnetic fields, and magnetic waves.

5. The method of claim 1 wherein the predetermined electrical stimulus further comprises a magnetic stimulus.

6. The method of claim 1 wherein the step of sensing the magnetic response of the functional circuitry area at each of a plurality of positions across the functional circuitry area of the integrated circuit is performed by a separate sensor at each of the plurality of positions.

7. The method of claim 1 wherein the magnetic response array includes a graphical representation of the strength of the magnetic responses.

8. The method of claim 7 wherein digital signal processing is used in the step of comparing the graphical representation for the integrated circuit to the at least one predetermined magnetic response array for the reference integrated circuit.

9. A method of characterizing integrated circuits of a predetermined design, the predetermined design including a functional circuitry area and a connection area with a plurality of pins for input and output of electrical signals to the functional circuitry area, comprising the steps of: creating a database relating magnetic response arrays to integrated circuit characteristics, by;

analyzing at least one reference integrated circuit of the predetermined design, where the characteristics of the reference integrated circuit are known, the analysis including;

producing a magnetic response from the functional circuitry area of the integrated circuit by applying a predetermined electrical stimulus to at least one of the pins of the connection area, sensing the magnetic response of the functional circuitry area at each of a plurality of positions across the functional circuitry area of the integrated circuit, capturing a quantitative indication of a strength of the magnetic response at each of the plurality of positions across the functional circuitry area of the integrated circuit, and creating a magnetic response array for the functional circuitry area based on the captured quantitative indications of the magnetic field strength at the plurality of positions, correlating the magnetic response array produced by the analysis with the known characteristics of the integrated circuit, and storing the correlated magnetic response array and the known characteristics of the integrated circuit in a record in the database, performing the steps of analysis on an uncharacterized integrated circuit of the predetermined design, comparing the magnetic response array for the uncharacterized integrated circuit with the magnetic response arrays for the reference integrated circuits in the database, selecting a record in the database based at least in part on similarities between the magnetic response array for the uncharacterized integrated circuit and the magnetic response array in the selected record, and characterizing the uncharacterized integrated circuit based at least in part on the characteristics for the reference integrated circuit listed in the selected record.

10. The method of claim 9 wherein the known characteristic of the reference integrated circuit is that the reference integrated circuit is fully functional within specified tolerances.

11. The method of claim 9 wherein the magnetic responses further comprise at least one of magnetic reflections, magnetic resonances, magnetic fields, and magnetic waves.

12. The method of claim 9 wherein the predetermined electrical stimulus further comprises a magnetic stimulus.

13. The method of claim 9 wherein the step of sensing the magnetic response of the functional circuitry area at each of a plurality of positions across the functional circuitry area of the integrated circuit is performed by a separate sensor at each of the plurality of positions.

14. The method of claim 9 wherein the magnetic response array includes a graphical representation of the strength of the magnetic responses.

15. The method of claim 14 wherein digital signal processing is used in the step of comparing the graphical representation for the integrated circuit to the at least one predetermined magnetic response array for the reference integrated circuit.

16. A testing system for characterizing an integrated circuit having a functional circuitry area and a connection area with a plurality of pins for input and output of electrical signals to the functional circuitry area, comprising:

a socket for receiving the integrated circuits and making electrical connections to the integrated circuit, means for applying a predetermined electrical stimulus through the electrical connections of the socket to at least one of the pins of the connection area and thereby producing a magnetic response from the functional circuitry area of the integrated circuit, means for sensing the magnetic response of the functional circuitry area at each of a plurality of positions across the functional circuitry area of the integrated circuit, means for capturing a quantitative indication of a strength of the magnetic response at each of the plurality of positions across the functional circuitry area of the integrated circuit, means for creating a magnetic response array for the functional circuitry area based on the captured quantitative indications of the magnetic field strength at the plurality of positions, and means for comparing the magnetic response array of the integrated circuit to at least one predetermined magnetic response array for a reference integrated circuit having a known characteristic; and means for characterizing the integrated circuit based at least in part on the comparison between the integrated circuit and the reference integrated circuit.

17. The system of claim 16 wherein the means for sensing the magnetic responses further comprise means for sensing at least one of magnetic reflections, magnetic resonances, magnetic fields, and magnetic waves.

18. The system of claim 16 wherein the means for sensing the magnetic response of the functional circuitry area at each of a plurality of positions across the functional circuitry area of the integrated circuit further comprises a separate sensor at each of the plurality of positions.

19. The system of claim 16 wherein the means for creating the magnetic response array further comprises means for creating a graphical representation of the strength of the magnetic responses.

20. The system of claim 19 wherein the means for comparing the magnetic response array of the integrated circuit to at least one predetermined magnetic response array for a reference integrated circuit further comprises digital signal processing means to compare the graphical representation for the integrated circuit to a graphical representation for the at least one predetermined magnetic response array for the reference integrated circuit.

* * * * *